(12) United States Patent
Kronholz et al.

(10) Patent No.: US 8,283,225 B2
(45) Date of Patent: Oct. 9, 2012

(54) ENHANCING SELECTIVITY DURING FORMATION OF A CHANNEL SEMICONDUCTOR ALLOY BY A WET OXIDATION PROCESS

(75) Inventors: Stephan Kronholz, Dresden (DE); Carsten Reichel, Dresden (DE); Falk Graetshe, Dresden (DE); Boris Bayha, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 157 days.

(21) Appl. No.: 12/824,614

(22) Filed: Jun. 28, 2010

(65) Prior Publication Data
US 2010/0327368 A1    Dec. 30, 2010

(30) Foreign Application Priority Data

Jun. 30, 2009  (DE) .......................... 10 2009 031 112
Nov. 19, 2009  (DE) .......................... 10 2009 046 877

(51) Int. Cl.
*H01L 21/8238*   (2006.01)
(52) U.S. Cl. .. 438/216; 438/275; 257/369; 257/E21.409
(58) Field of Classification Search .................. 438/216, 438/275; 257/369, E21.409
See application file for complete search history.

(56) References Cited

U.S. PATENT DOCUMENTS

| | | | |
|---|---|---|---|
| 2005/0040436 A1 | 2/2005 | Sorada et al. | 257/206 |
| 2006/0125029 A1 | 6/2006 | Kanda | 257/410 |
| 2008/0079086 A1 | 4/2008 | Jung et al. | 257/369 |
| 2010/0193881 A1 | 8/2010 | Kronholz et al. | 257/402 |

FOREIGN PATENT DOCUMENTS

DE    102009006886 A1    8/2010

OTHER PUBLICATIONS

Translation of Official Communication from German Patent Office for German Patent Application No. 10 2009 046 887.3 dated Jul. 1, 2011.

*Primary Examiner* — Jarrett Stark
*Assistant Examiner* — John M Parker
(74) *Attorney, Agent, or Firm* — Williams, Morgan & Amerson, P.C.

(57) ABSTRACT

High-k metal gate electrode structures are formed on the basis of a threshold adjusting semiconductor alloy formed in the channel region of one type of transistor, which may be accomplished on the basis of selective epitaxial growth techniques using an oxide hard mask growth mask. The hard mask may be provided with superior thickness uniformity on the basis of a wet oxidation process. Consequently, this may allow reworking substrates prior to the selective epitaxial growth process, for instance in view of queue time violations, while also providing superior transistor characteristics in the transistors that do not require the threshold adjusting semiconductor alloy.

17 Claims, 7 Drawing Sheets

ENHANCING SELECTIVITY DURING FORMATION OF A CHANNEL SEMICONDUCTOR ALLOY BY A WET OXIDATION PROCESS

BACKGROUND OF THE INVENTION

1. Field of the Invention

Generally, the present disclosure relates to sophisticated integrated circuits including advanced transistor elements that comprise highly capacitive gate structures including a metal-containing electrode and a high-k gate dielectric of increased permittivity.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits are fabricated on the basis of silicon, due to the substantially unlimited availability thereof, the well-understood characteristics of silicon and related materials and processes and the experience gathered over the last 50 years. Therefore, silicon will likely remain the material of choice in the foreseeable future for circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current due to the required enhanced capacitive coupling of the gate electrode to the channel region that is accomplished by decreasing the thickness of the silicon dioxide layer. For example, a channel length of approximately 0.08 µm may require a gate dielectric made of silicon dioxide as thin as approximately 1.2 nm. Although, generally, usage of high speed transistor elements having an extremely short channel may be restricted to high-speed signal paths, whereas transistor elements with a longer channel may be used for less critical signal paths, the relatively high leakage current caused by direct tunneling of charge carriers through an ultra-thin silicon dioxide gate insulation layer may reach values for an oxide thickness in the range of 1-2 nm that may no longer be compatible with requirements for many types of integrated circuits.

Therefore, replacing silicon dioxide, or at least a part thereof, as the material for gate insulation layers has been considered. Possible alternative dielectrics include materials that exhibit a significantly higher permittivity so that a physically greater thickness of a correspondingly formed gate insulation layer nevertheless provides a capacitive coupling that would be obtained by an extremely thin silicon dioxide layer. It has thus been suggested to replace silicon dioxide with high permittivity materials, such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

When advancing to sophisticated gate architecture based on high-k dielectrics, additionally, transistor performance may also be increased by providing an appropriate conductive material for the gate electrode so as to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance even at a less critical thickness compared to a silicon dioxide layer, while additionally maintaining leakage currents at an acceptable level. On the other hand, metal-containing non-polysilicon material, such as titanium nitride and the like, may be formed so as to directly connect to the high-k dielectric material, thereby substantially avoiding the presence of a depletion zone. Therefore, the threshold voltage of the transistors is significantly affected by the work function of the gate material that is in contact with the gate dielectric material, and an appropriate adjustment of the effective work function with respect to the conductivity type of the transistor under consideration has to be guaranteed.

For example, appropriate metal-containing gate electrode materials, such as titanium nitride and the like, may frequently be used in combination with appropriate metal species, such as lanthanum, aluminum and the like, to adjust the work function to be appropriate for each type of transistor, i.e., N-channel transistors and P-channel transistors, which may require an additional band gap offset for the P-channel transistor. For this reason, it has been proposed to appropriately adjust the threshold voltage of transistor devices by providing a specifically designed semiconductor material at the interface between the high-k dielectric material and the channel region of the transistor device, in order to appropriately "adapt" the band gap of the specifically designed semiconductor material to the work function of the metal-containing gate electrode material, thereby obtaining the desired low threshold voltage of the transistor under consideration. Typically, a corresponding specifically designed semi-conductor material, such as silicon/germanium and the like, may be provided by an epitaxial growth technique at an early manufacturing stage, which may also present an additional complex process step, which, however, may avoid complex processes in an advanced stage for adjusting the work function and thus the threshold voltages in a very advanced process stage.

It turns out, however, that the manufacturing sequence of forming the threshold adjusting semiconductor alloy may have a significant influence on transistor characteristics, as will be described in more detail with reference to FIGS. 1a-1f.

Figure 1A:
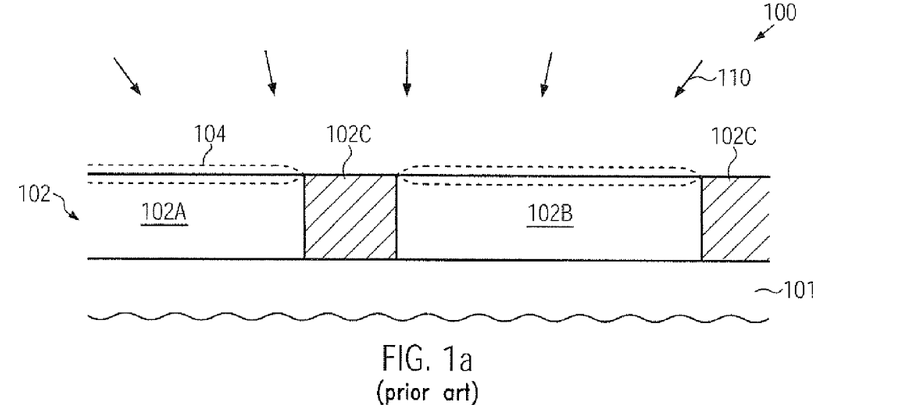
FIGS. 1a-1f schematically illustrate cross-sectional views of a conventional semiconductor device in which sophisticated gate electrode structures are formed on the basis of a threshold adjusting germanium alloy, thereby causing transistor variabilities.

FIG. 1a schematically illustrates a cross-sectional view of a semiconductor device 100 comprising a substrate 101 above which is formed a silicon-based semiconductor material 102 having an appropriate thickness for forming therein and thereabove transistor elements. Furthermore, an isolation structure 102C is formed in the semiconductor layer 102, thereby laterally delineating and thus defining active regions 102A, 102B. In this context, an active region is to be understood as a semiconductor material in which an appropriate dopant profile is formed or is to be created in order to form PN junctions for one or more transistor elements. In the example shown in FIG. 1a, the active region 102A corresponds to a P-channel transistor while the active region 102B represents an N-channel transistor. That is, the active regions 102A, 102B comprise an appropriate basic dopant concentration in order to determine the conductivity of a P-channel transistor and an N-channel transistor, respectively. It should be appreciated that the active regions 102A, 102B may comprise or may receive other components, such as germanium, carbon and the like, in order to appropriately adjust the overall electronic characteristics. Similarly, in the active region 102A, an appropriate valence band offset is to be adjusted with respect to a sophisticated gate electrode structure still to be formed by forming an appropriate semiconductor alloy, as will be described later on.

The semiconductor device 100 as illustrated in FIG. 1a may be formed on the basis of the following conventional process strategies. First, the isolation structure 102C is formed by well-established lithography, etch, deposition, planarization and anneal techniques, in which a trench is formed in the semiconductor layer 102, which is subsequently filled with an appropriate insulating material, such as silicon dioxide and the like. It should be appreciated that the process sequence for forming the isolation structure 102C may result in a more or less pronounced stress level that may be induced in the active regions 102A, 102B, for instance by forming a dense silicon oxide material, at least partially, in the isolation trenches 102C, which may result in a stressed state of a portion of the silicon dioxide material. After removing any excess material and planarizing the surface topography, the further processing is typically continued by performing a plurality of implantation processes using an appropriate masking regime in order to introduce the required dopant species for generating the basic dopant concentration in the active regions 102A, 102B corresponding to the type of transistors to be formed therein and thereabove. After activating the dopant species and re-crystallizing implantation-induced damage, the further processing is continued by exposing the device 100 to an oxidizing ambient 110, which is typically established on the basis of elevated temperatures, for instance in the range of 700-1200° C., and supplying oxygen in order to obtain a desired oxidation rate. Consequently, during the dry oxidation process 110, a mask layer 104 may be formed in a well-controllable manner during the process 110. For instance, a maximum thickness of the mask layer 104 may be 10 nm or less.

Figure 1B:
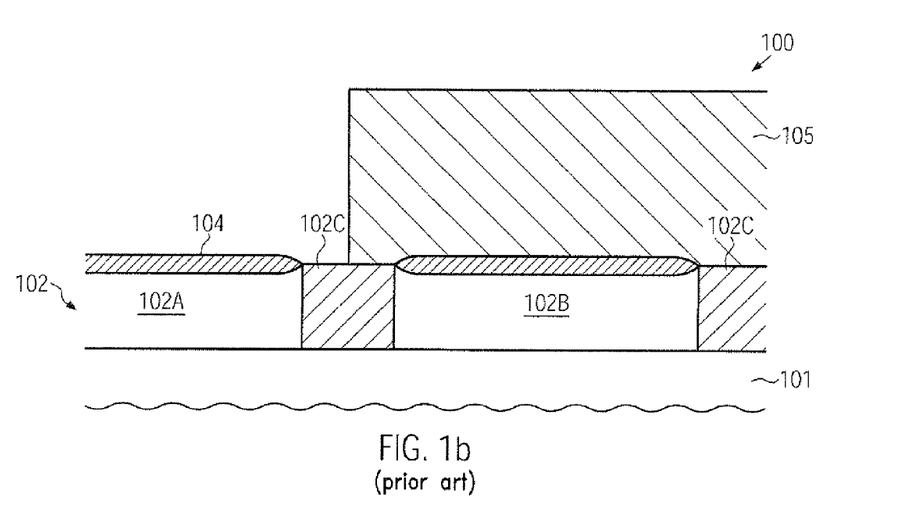

FIG. 1b schematically illustrates the semiconductor device 100 in a further advanced manufacturing stage in which an etch mask 105, such as a resist mask, is formed above the semiconductor device 100 such that the mask material 104 on the first active region 102A is exposed, while the portion of the mask material 104 formed on the second active region 102B is protected by the mask 105. The etch mask 105 may be formed by any well-established lithography techniques. Thereafter, an etch process is applied in order to selectively remove the mask material 104 from the first semiconductor region 102A, which is typically accomplished by using any selective etch chemistry, such as diluted hydrofluoric acid (HF), which enables a selective removal of silicon dioxide material while substantially not attacking silicon material.

Figure 1C:
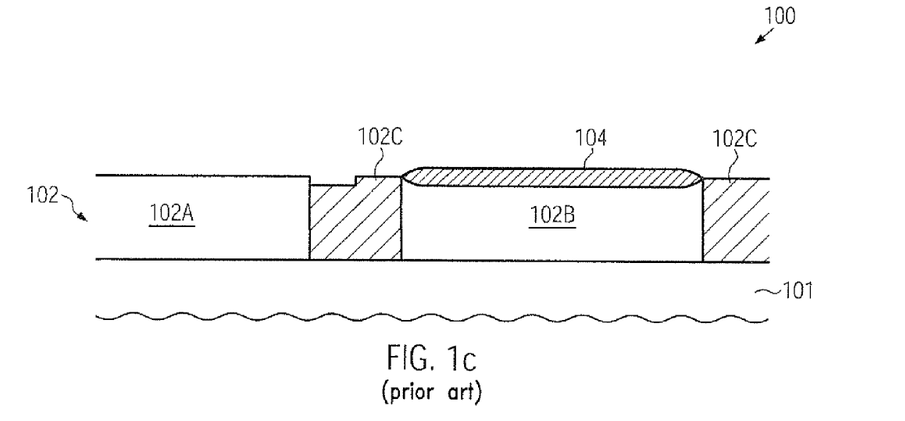

FIG. 1c schematically illustrates the semiconductor device 100 in a further advanced manufacturing stage, i.e., after the selective removal of the mask material 104 and the removal of the etch mask 105 (FIG. 1b). It should be appreciated that, due to the preceding etch sequence, a certain material loss may also occur in the isolation structure 102C, i.e., in an exposed portion thereof.

Figure 1D:
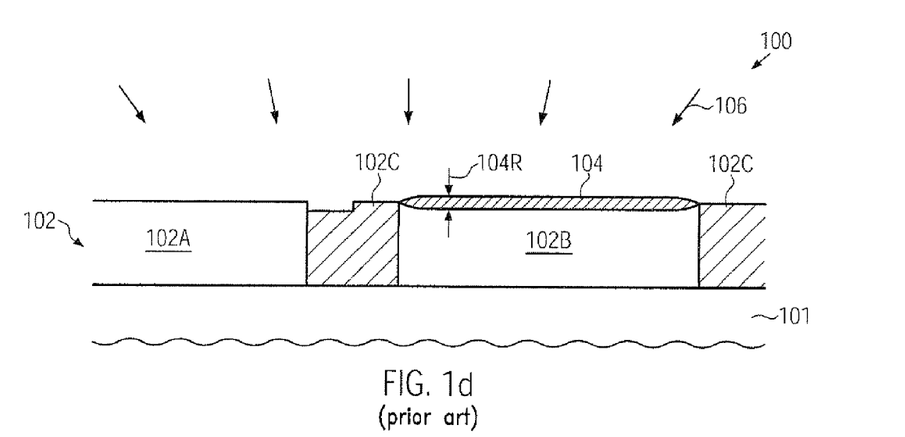

FIG. 1d schematically illustrates the semiconductor device 100 when exposed to a further reactive process ambient 106, which may include a cleaning process and the like in order to prepare the device 100 for the subsequent deposition of a silicon/germanium alloy selectively on the first active region 102A. The process 106 may be established on the basis of any appropriate chemistries in order to remove contaminants and the like, which may have been created during the previous removal of the etch mask and the like. Typically, the cleaning process 106 may cause a certain degree of material erosion of the mask 104, thereby reducing a thickness thereof, as indicated by 104R, however without intending to expose surface portions of the second active region 102B. It should be appreciated that the cleaning process 106, which may remove native oxides and the like, may be required so as to obtain appropriate surface conditions for epitaxially growing the silicon/germanium material in the subsequent process step. In order to not unduly expose the semiconductor device 100 to any other environmental conditions, such as the clean room atmosphere and the like, typically, a very restricted queue time requirement may have to be respected, i.e., a certain time interval between the cleaning process 106 and the subsequent actual deposition of the silicon/germanium alloy should not be exceeded in view of the process quality of the subsequent deposition process.

Figure 1E:
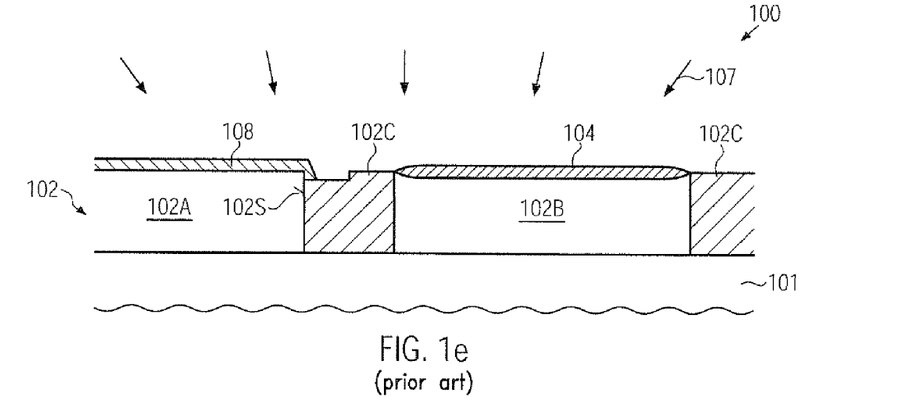

FIG. 1e schematically illustrates the semiconductor device 100 during a selective epitaxial growth process 107 in which process parameters, such as temperature, pressure, flow rates of precursor gasses and the like, are appropriately selected such that material deposition may be substantially restricted to exposed silicon surface areas, while the dielectric surfaces may substantially prevent a deposition of material. Consequently, during the process 107, a silicon/germanium material 108 may be selectively formed on the active region 102A and to a certain degree on the isolation structure 102C, depending on the degree of exposure of any sidewall surfaces 102S of the active region 102A. As previously explained, the finally obtained threshold of a transistor to be formed in and above the active region 102A may strongly depend on the characteristics of the layer 108, such as the germanium concentration and the thickness thereof, such that precisely determined process conditions have to be established during the process 107, and thus also during the cleaning process 106 (FIG. 1d), and a time interval between these two process steps. It should be appreciated that a further cleaning process may typically be performed prior to actually depositing the material 108, which, however, may also strongly depend on the efficiency of the cleaning process 106. On the other hand, the mask layer 104 efficiently prevents material deposition on the active region 102B in view of transistor characteristics of a corresponding N-channel transistor to be formed in and above the active region 102B.

After the deposition process 107, the mask layer 104 is removed, for instance by using selective wet chemical etch recipes, and thereafter the further processing is continued by forming the actual transistor structures.

Figure 1F:
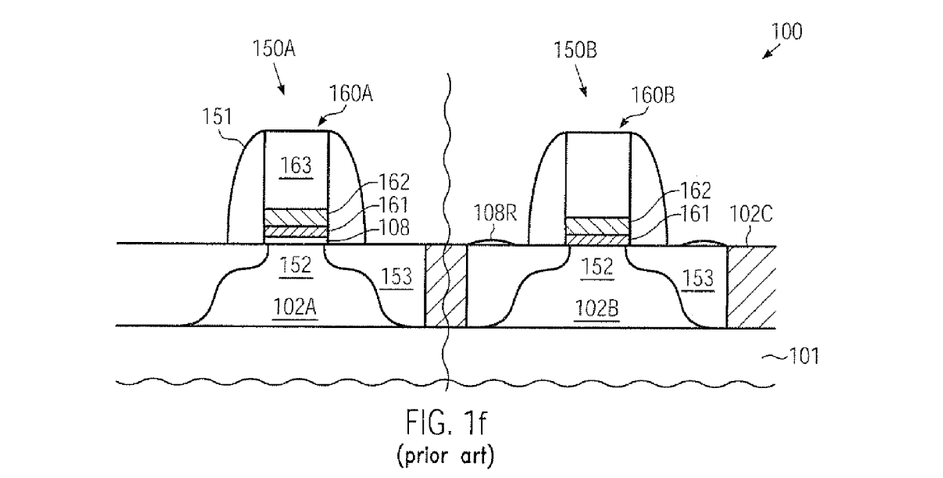

FIG. 1f schematically illustrates the semiconductor device 100 in a further advanced manufacturing stage in which a transistor 150A is formed in and above the active region 102A, including at least a portion of the silicon/germanium alloy 108. Similarly, a transistor 150B is formed in and above the active region 102B, wherein, in the transistor 150B, the presence of a silicon/germanium alloy should be avoided. In the manufacturing stage shown, the transistors 150A, 150B, which represent a P-channel transistor and an N-channel transistor, respectively, comprise a gate electrode structure 160A and 160B, respectively. As shown, the gate electrode structure 160A is formed on the threshold adjusting silicon/germanium alloy 108 and comprises a gate dielectric material 161 comprising a high-k dielectric material, in combination with a metal-containing electrode material 162. Furthermore, a "conventional" electrode material, such as a polysilicon material 163, is typically formed above the electrode material 162. The gate electrode structure 160B has a similar configuration, except for the threshold adjusting silicon/germanium alloy 108, so that the gate dielectric material 161 is directly formed on the active region 102B. Furthermore, the transistors 150A, 150B comprise a spacer structure 151, which may have any appropriate configuration in order to obtain a desired dopant profile for drain and source regions 153 and to provide a desired mask for a silicidation process, which may still be performed in a later manufacturing stage. Additionally, a channel region 152 is laterally enclosed by the drain and source regions 153 and connects to the gate dielectric material 161. Thus, in the transistor 150A, the channel region 152 may also comprise a portion of the silicon/germanium alloy, thereby providing a desired work function and thus threshold of the transistor 150A.

The semiconductor device 100 as illustrated in FIG. 1f may be formed on the basis of any well-established process techniques which include the deposition of the material 161, 162 and 163, possibly in combination with other materials, such as dielectric cap layers, anti-reflective coating (ARC) materials, hard mask materials and the like. It should be appreciated that the materials 161 and 162 may thus be selected such that a desired high capacitive coupling is achieved in combination with a superior conductivity, while also a desired work function and thus threshold for the transistor 150B may be set without requiring any additional band gap adjustments. After the patterning of the sophisticated layer stack in order to obtain the gate electrode structures 160A, 160B, the drain and source regions 153 may be formed on the basis of well-established implantation techniques using appropriate masking regimes. It should be appreciated that additional strain-inducing mechanisms may be implemented, if required. In principle, the transistors 150A, 150B may provide superior performance and may allow the adjustment of the basic transistor characteristics in an early manufacturing stage due to the provision of the silicon/germanium alloy 108 and appropriate metal species in the layer 162, thereby avoiding sophisticated manufacturing techniques in a very advanced manufacturing stage in order to appropriately adjust the threshold voltages of field effect transistors, as may be required in so-called replacement gate approaches.

However, it turns out that a certain degree of transistor variability may be observed since, in the transistor 150B, due to the presence of silicon/germanium residues 108R, which may be created in an early manufacturing stage when forming the silicon/germanium layer 108 (FIG. 1e). For example, the presence of the residues 108R may change the electronic characteristics of the active region 102B and may also have a negative influence during the further processing, for instance when forming metal silicide regions in the drain and source regions 153. On the other hand, a certain degree of transistor variability may also be observed for the P-channel transistor 150A, which may be correlated with the corresponding queue time dependency, as previously explained, in particular when the device 100 may be re-worked, for instance subjected to an additional cleaning process due to a queue time violation prior to the deposition of the silicon/germanium layer 108.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and techniques for forming complex gate electrode structures on the basis of a threshold adjusting semiconductor alloy, wherein transistor variability may be reduced and enhanced flexibility in scheduling the overall process flow, in particular with respect to queue time violations between a cleaning process and a subsequent selective epitaxial growth process, may be enhanced. Without intending to restrict the present application to the following explanation, it is nevertheless believed that a significant variation of layer thickness of a growth mask formed by conventional oxidation processes may result in a reduced reliability for preventing material deposition on active regions of the N-channel transistors, in particular upon re-working substrates having experienced a queue time violation. It is assumed that the stress conditions in the active regions may result in a locally varying oxidation rate, thereby providing a reduced thickness at a boundary region formed between an isolation structure and an active region, which typically contains the maximum stress component. For this reason, the silicon oxide growth mask may have a significantly reduced thickness at the edge of the active regions compared to the center thereof, which may significantly increase the probability of exposing certain surface areas prior to the deposition of the threshold adjusting semiconductor material, which may thus also form locally in the active regions of transistors, which may be negatively influenced by the presence of the threshold adjusting semiconductor alloy. Consequently, an oxide-based material layer may be formed by oxidation in which an oxidation rate of enhanced local uniformity may be obtained, thereby contributing to a more uniform layer thickness, which in turn reduces the probability of creating unwanted material residues without requiring an increase of layer thickness at the center of the active regions.

One illustrative method disclosed herein comprises forming an oxide layer on a first active region and a second active region of a semiconductor device by performing a wet oxidation process. The method further comprises removing the oxide layer selectively from the first active region and forming a layer of a semiconductor alloy on the first active region by using the oxide layer on the second active region as a growth mask. Thereafter, the oxide layer is removed from the second active region. Finally, the method further comprises forming a first gate electrode structure of a first transistor on the layer of semiconductor alloy and forming a second gate electrode structure of a second transistor on the second active region, wherein the first and second gate electrode structures comprise a gate insulation layer and a metal-containing gate electrode material and wherein the gate insulation layer comprises a high-k dielectric material.

A further illustrative method disclosed herein relates to forming a semiconductor device. The method comprises forming a silicon oxide layer on a first active region and a second active region by performing an oxidation process, wherein the first and second active regions are delineated by an isolation structure and wherein a thickness variation of the silicon oxide in the first and second active regions is approximately 20 percent or less. The method further comprises removing the silicon oxide layer selectively from above the first active region and forming a threshold adjusting semiconductor material in the first active region by using the silicon oxide layer formed on the second active region as a deposition mask. Additionally, the silicon oxide layer is removed from above the second active region and a first gate electrode structure of a first transistor is formed on the threshold adjusting semiconductor material and a second gate electrode structure of a second transistor is formed on the second active region.

One illustrative semiconductor device disclosed herein comprises an isolation structure formed in a semiconductor layer and a first active region formed in the semiconductor layer, wherein the first active region is laterally delineated by the isolation structure. A threshold adjusting semiconductor alloy is selectively formed on the first active region. The semiconductor device further comprises a second active region formed in the semiconductor layer and laterally delineated by the isolation structure, wherein the second active region and a boundary region formed between the isolation structure and the second active region exclude the threshold adjusting semiconductor alloy. A first gate electrode structure is formed on the threshold adjusting semiconductor alloy and comprises a high-k dielectric material and a metal-containing electrode material that is formed above the high-k dielectric material. Additionally, the semiconductor device comprises a second gate electrode structure formed on the second active region and comprising the high-k dielectric material and the metal-containing electrode material.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As briefly discussed above, it is assumed that the stress conditions in the active regions of sophisticated semiconductor devices may have a significant influence on the local oxidation rate during the formation of a mask layer, thereby resulting in a locally varying oxide thickness, which may be up to 40 percent less at the periphery of the active regions, i.e., at the isolation structures, compared to the center of the active regions. This difference in oxide thickness may result in non-uniformities during the further processing, for instance in view of growing a threshold adjusting semiconductor alloy in one type of active region, which may result in a certain degree of transistor variability, such as threshold variability, as the threshold voltage may strongly depend on the uniformity of the threshold adjusting semiconductor alloy, as discussed above. Furthermore, the masking effect of the oxide mask layer may deteriorate during the further processing prior to actually depositing the threshold adjusting semiconductor alloy, thereby contributing to further transistor variabilities since the threshold adjusting semiconductor alloy may also grow at unwanted locations, i.e., at the boundary region between active regions and isolation structures of transistors whose characteristics may be negatively influenced by the semiconductor alloy, such as a silicon/germanium alloy formed at the periphery of active regions of N-channel transistors. On the other hand, providing an oxide mask formed on the basis of a high temperature oxidation process may result in superior material characteristics in terms of density and thus material integrity during the further processing so that a deposition of a mask material may be less than desirable in an attempt to obtain a more uniform layer thickness. For this reason, the present disclosure provides techniques and semiconductor devices in which the growth rate may be made more uniform so that a defined maximum thickness at the center of the active regions may also result in a sufficient thickness at the peripheral areas of the active regions in order to reliably avoid undue material growth in these areas. On the other hand, the enhanced uniformity of the oxide thickness may also provide superior conditions during the epitaxial growth on the other type of active regions after the selective removal of the masking oxide layer. In one illustrative embodiment disclosed herein, a superior growth behavior during the oxidation process may be accomplished by applying a "wet" oxidation process at appropriately selected temperatures, for instance in the range of approximately 500-1200° C., so that, in the corresponding process ambient, water molecules may act as the oxygen supply. For this purpose, hydrogen may be supplied to an oxidizing ambient and/or water vapor or steam may be supplied in order to provide superior oxidation conditions. Due to the different diffusion behavior of water molecules compared to oxygen molecules, which are typically used in conventional strategies, a growth behavior may be accomplished that does not substantially depend on the crystallographic configuration of the silicon material in the active regions and thus is significantly less dependent from the stress conditions in the active region. Consequently, during the wet oxidation process, a very uniform oxide layer may be formed with the desired material characteristics, for instance in terms of density and the like, while a high degree of controllability may also be accomplished on the basis of process parameters, such as temperature, water vapor flow rate, oxygen flow rate, hydrogen flow rate and the like.

In other illustrative embodiments, the oxidation rate may be locally adapted by increasing the available surface area at the periphery of the active region, for instance during an oxidation process performed on the basis of oxygen gas, which may also be referred to as a dry oxidation, thereby also providing an increased thickness at the critical peripheral areas. For this purpose, material of the isolation structures may be selectively removed in a controlled manner in order to obtain a certain recess with respect to the adjacent active regions, thereby exposing corresponding sidewall surface areas which are then available for oxygen diffusion.

With reference to FIGS. 2a-2g, further illustrative embodiments will now be described in more detail, wherein reference may also be made to FIGS. 1a-1e, if appropriate.

Figure 2A:
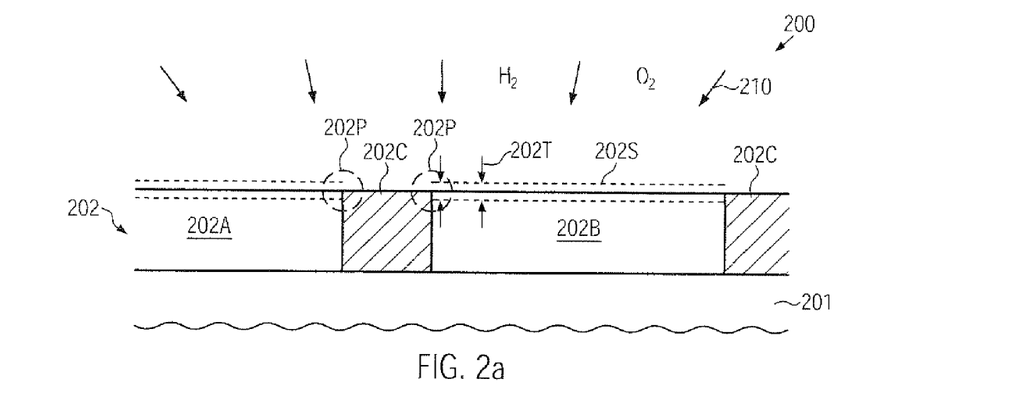
FIGS. 2a-2e schematically illustrate cross-sectional views of a semiconductor device during various manufacturing stages in forming sophisticated gate electrode structures on the basis of a threshold adjusting semiconductor alloy with reduced transistor variabilities and non-uniformities due to the provision of a deposition mask formed on the basis of a wet oxidation process, according to illustrative embodiments.

FIG. 2a schematically illustrates a semiconductor device 200 comprising a substrate 201 and a device layer 202, which, in the manufacturing stage shown, may comprise a substantially crystalline semiconductor material in the form of a plurality of active regions 202A, 202B and may comprise an isolation structure 202C which may laterally delineate the active regions 202A, 202B according to the overall requirements of the circuit layout of the device 200. It should be appreciated that the device layer 202 may initially be provided as a continuous semiconductor layer and thus the layer 202 may also be referred to as a "semiconductor layer," irrespective of the fact that the "semiconductor layer" 202 may be comprised of a plurality of semiconductor "islands" in the form of the active regions 202A, 202B in this manufacturing stage. Furthermore, in some illustrative embodiments (not shown), the semiconductor layer 202 and the substrate 201 may represent a silicon-on-insulator (SOI) configuration when a buried insulating layer (not shown) is formed between the substrate 201 and the semiconductor layer 202. In this case, the active regions 202A, 202B may be completely insulated from each other. As also previously discussed, the active regions 202A, 202B may have any appropriate size and shape in order to form one or more transistor elements in and above the active regions, wherein sophisticated gate electrode structures may have to be provided with a gate length of approximately 50 nm and less in combination with an advanced gate design by using a high-k dielectric material in combination with a metal-containing electrode material.

With respect to any process strategies for forming the semiconductor device 200 as illustrated in FIG. 2a, the same criteria may apply as previously explained with reference to the semiconductor device 100. Furthermore, after forming the isolation structure 202C and establishing a desired basic doping of the active regions 202A, 202B, the device 200 may be exposed to a wet oxidation ambient 210 in order to oxidize a surface region 202S of the active regions 202A, 202B on the basis of a predefined maximum thickness so as to not unduly consume material of the active regions 202A, 202B. For example, a maximum thickness 202T of the oxidized portion may be selected to be approximately 10 nm and less, such as 8 nm and less, wherein a reduced layer thickness may be selected compared to conventional strategies due to the superior uniformity of the wet oxidation process 210 compared to a dry oxidation as is typically applied in conventional strategies. The wet oxidation process 210 may be performed in the presence of oxygen and hydrogen, for instance by supplying these gases on the basis of appropriate gas flow rates, which may be readily determined on the basis of experiments and the like. For instance, for presently available rapid thermal anneal (RTA) tools, an appropriate wet oxidizing ambient may be established by using a flow rate of approximately 10-30 slm (standard liter per minute) of oxygen and 0.1-20 slm of hydrogen, when substrates with a diameter of 200-300 mm are used. Furthermore, the process temperature may be selected in the range of approximately 500-1200° C. and an appropriate pressure of several hundred mTorr to several Torr may be adjusted. It should be appreciated that any appropriate process tool, and thus parameters which may depend on the type of process tool used, may be selected in order to perform the wet oxidation process 210, wherein appropriate process parameters may be readily determined on the basis of experiments in which an appropriate thickness 202T may be determined based on the finally obtained material characteristics and the subsequent manufacturing strategy. In other illustrative embodiments, the wet oxidation ambient 210 may be established by supplying water vapor, possibly in combination or alternatively to oxygen and/or hydrogen, wherein appropriate process parameters, such as flow rate and the like, may be selected on the basis of experiments and the like.

Due to the application of a wet oxidation process instead of a dry oxidation process, the oxidation rate may be significantly more uniform and thus enhanced uniformity of the thickness 202T may be accomplished even at critical peripheral areas 202P, i.e., at a boundary region defined by the isolation structure 202C and the edge of the active regions 202A, 202B. For example, a thickness at the peripheral region 202P from the target thickness 202T at the center of the active region may deviate by approximately less than 20 percent and, in some illustrative embodiments, the thickness variation across a single active region may be less than approximately 10 percent of the maximum thickness.

Figure 2B:
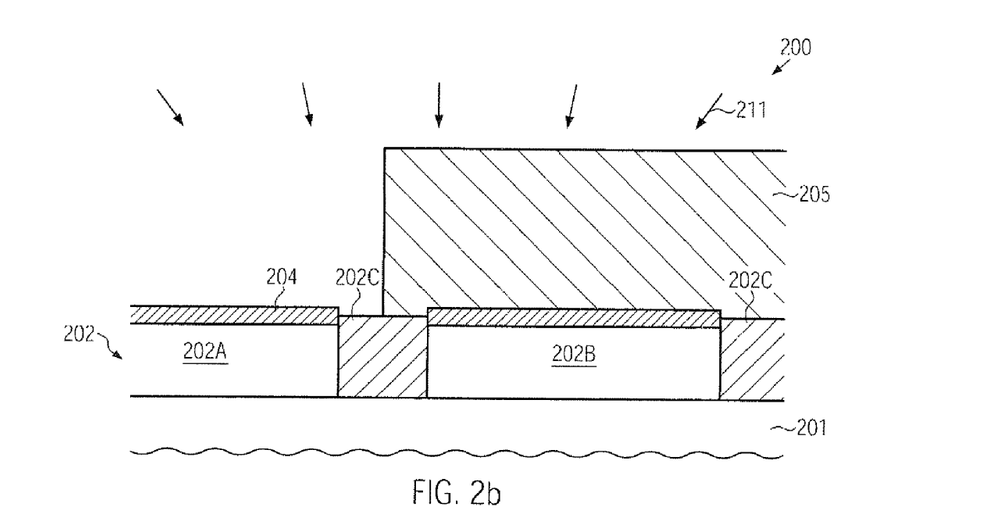

FIG. 2b schematically illustrates the semiconductor device 200 with an oxide mask layer 204 formed on the active regions 202A, 202B with superior uniformity. Furthermore, an etch mask 205 may be provided so as to expose the mask layer 204 above the active region 202A while covering the portion of the mask layer 204 formed on the active region 202B. With respect to providing the etch mask 205, for instance in the form of a resist mask or any other appropriate mask material, it may be referred to the semiconductor device 100. Moreover, the device 200 may be exposed to an etch ambient 211 in order to remove the exposed portion of the mask layer 204, which may be accomplished on the basis of any appropriate etch chemistry, such as diluted HF and the like. Due to the superior uniformity of the mask layer 204, the etch process 211 may also be performed on the basis of superior process conditions. After the etch process 211, the etch mask 205 may be removed by using any appropriate etch strategy.

Figure 2C:
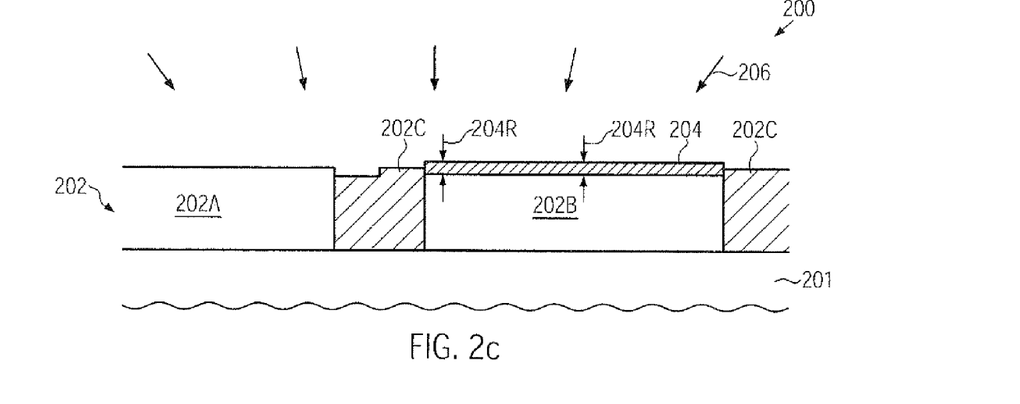

FIG. 2c schematically illustrates the semiconductor device 200 in a further advanced manufacturing stage. As illustrated, the device 200 may be exposed to a reactive process ambient 206, which may also be referred to as a cleaning process, in order to prepare the active region 202A for a subsequent selective epitaxial growth process, as is previously discussed with reference to FIGS. 1a-1f. On the other hand, the remaining portion of the mask layer 204 may reliably cover the active region 202B. As described with reference to the device 100, the cleaning process 206 may remove oxide materials, contaminants and other components, thereby also causing a certain degree of material loss of the mask layer 204, thereby resulting in a reduced thickness 204R thereof. Contrary to the conventional strategy, however, the reduced thickness 204R may have a superior uniformity and thus a less pronounced difference between peripheral regions and central regions of the active region may be achieved. Consequently, the thickness 204R may also vary by less than approximately 20 percent, while, in other cases, a variability in thickness of approximately less than 10 percent may be achieved.

As discussed above, the scheduling regime in a complex manufacturing facility may require certain waiting times between subsequent manufacturing processes, for instance due to predictable or non-predictable delays, which may be caused by predictable or non-predictable maintenance events and the like, wherein a queue time "violation" may frequently occur, in particular if the used time intervals are considered allowable between critical process steps. For instance, the cleaning process 206 and the subsequent selective epitaxial growth process may represent critical process steps in the sense that an undue waiting time between these two process steps may result in deteriorated surface conditions, which in turn may contribute to process variabilities during the selective epitaxial deposition of the threshold adjusting semiconductor material, which in turn may result in different transistor characteristics, as discussed above. Consequently, in some illustrative embodiments, the superior uniformity of the reduced thickness 204R may be selected so as to still provide process margins with respect to a re-working scenario when the substrate 201 may experience a queue time violation with respect to the subsequent selective epitaxial growth process.

Figure 2D:
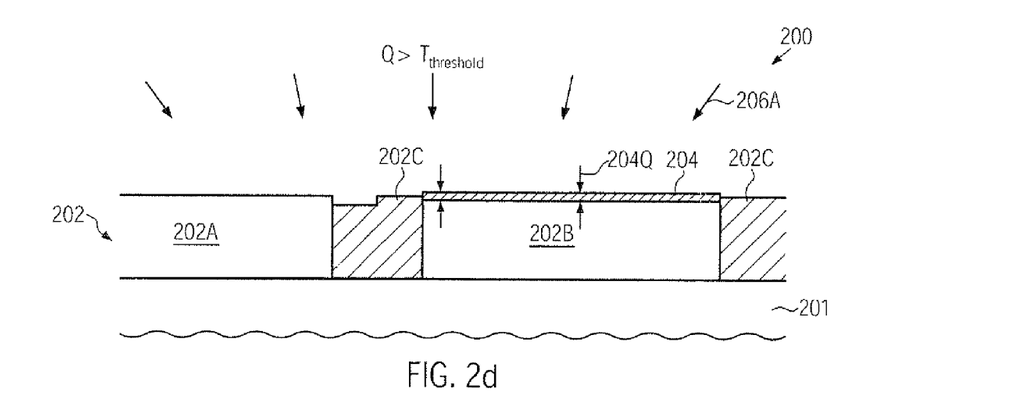

FIG. 2d schematically illustrates the semiconductor device 200 in a case in which the device 200 may not be processed in a subsequent selective epitaxial growth process within an allowable time interval so that a further cleaning process 206A may have to be performed in order to provide the required surface conditions for the subsequent processing. Hence, in this time, the actual queue time Q of the device 200 is greater than a predefined threshold T, thereby requiring the cleaning process 206A. On the other hand, for any semiconductor devices 200 respecting the allowable queue time T, the further processing may be continued by a selective epitaxial growth process as described in FIG. 2e.

During the cleaning process 206A, which may be performed on the basis of similar process parameters as the process 206 of FIG. 2c, the active region 202A may be "reworked," while a certain material erosion may also take place in the mask layer 204, thereby creating a further reduced thickness 204Q, which, however, may nevertheless provide reliable coverage of the active region 202B due to the superior uniformity of the previous thickness 204R (FIG. 2c). Consequently, the superior uniformity of the mask layer 204 may provide enhanced flexibility in the manufacturing flow since any queue time violations may not result in a loss of the involved substrates that may allow for at least one re-work cycle.

Figure 2E:
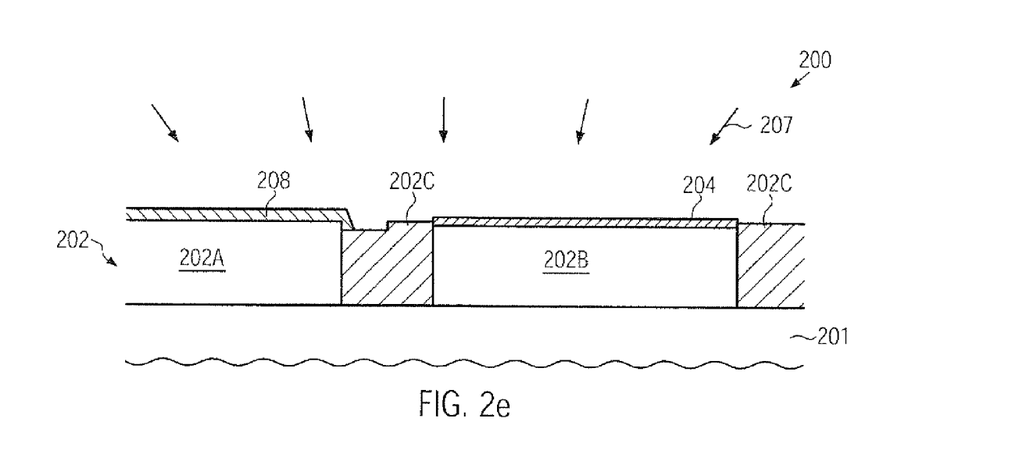

FIG. 2e schematically illustrates the semiconductor device 200, which may represent the device of FIG. 2c if no queue time violation has occurred, or which may represent the device 200 of FIG. 2d when a queue time violation has required a re-working of the device 200. During the selective epitaxial growth process 207, a threshold adjusting semiconductor material 208 may be selectively formed on the active region 202A with any appropriate thickness and material composition in order to obtain a desired threshold in combination with a sophisticated gate electrode structure still to be formed. In one illustrative embodiment, the semiconductor material 208 may represent a silicon/germanium alloy having a germanium concentration of approximately 20 atomic percent germanium and higher in order to obtain an appropriate valence band offset for a P-channel transistor. On the other hand, the active region 202B may represent a P-doped region for an N-channel transistor. After the selective epitaxial growth process 207, the mask layer 204 may be removed, as discussed above with reference to the device 100, and the further processing may be continued by forming the transistor structures.

Figure 2F:
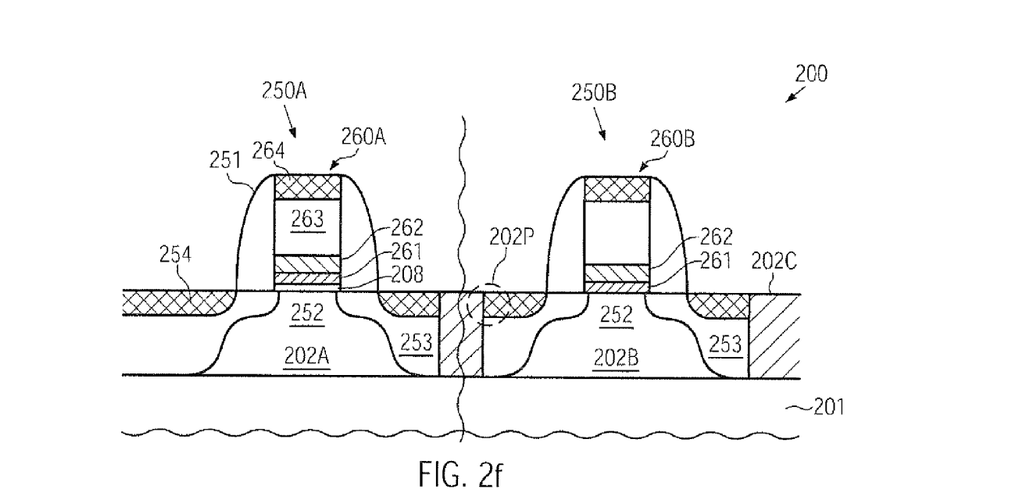
FIGS. 2f-2h schematically illustrate cross-sectional views of the semiconductor device according to still other illustrative embodiments in which superior thickness uniformity of the oxide mask layer may be accomplished by increasing an oxidation rate at the isolation structures by removing material therefrom.

FIG. 2f schematically illustrates the semiconductor device 200 in an advanced manufacturing stage. As illustrated, a transistor 250A, such as a P-channel transistor, may be formed in and above the active region 202A which may comprise a channel region 252 and drain and source regions 253, possibly in combination with metal silicide regions 254. It should be appreciated that at least the channel region 252 may comprise the threshold adjusting semiconductor alloy 208 having an appropriate material composition and thickness, as specified above, thereby adjusting a threshold of the transistor 250A, in combination with a gate dielectric material 261 and a metal-containing electrode material 262 of a gate electrode structure 260A. Furthermore, the electrode structure 260A may comprise an additional electrode material 263, such as a polysilicon material, a silicon/germanium material and the like, possibly in combination with a metal silicide material 264. Similarly, a gate electrode structure 260B of the transistor 250B may comprise the gate dielectric material 261 that is formed on the active region 202B. A further configuration of the gate electrode structure 260B may be substantially the same as in the gate electrode structure 260A. As also previously discussed with reference to FIG. 1f, typically, the gate dielectric material 261 may comprise a high-k dielectric material, possibly in combination with a conventional dielectric material, while the metal-containing electrode material 262 may comprise any appropriate metal species. It should be appreciated that, if required, the material 262 in the gate electrode structures 260A, 260B may differ in at least one metal species, if considered appropriate. Furthermore, a sidewall spacer structure 251 may be formed on sidewalls of the gate electrode structures 260A, 260B.

The semiconductor device 200 as illustrated in FIG. 2f may be formed on the basis of any appropriate process strategy for patterning the sophisticated gate electrode structures 260A, 260B and for forming the drain and source regions 253 in combination with the metal silicide regions 254. Furthermore, if desired, any additional strain-inducing mechanism may be implemented, for instance, by incorporating a strain-inducing semiconductor alloy into a portion of the drain and source regions 253, for instance by using a silicon/germanium alloy, a silicon/tin alloy, a silicon/germanium/tin alloy, if a compressive strain component is considered appropriate, while a silicon/carbon alloy may be provided when a tensile strain component may be appropriate for enhancing transistor performance. During the overall process sequence it may be provided, in particular at a peripheral region 202P of the active region 202B, due to the absence of the threshold adjusting semiconductor alloy 208, as explained above. For example, in particular, enhanced uniformity during the formation of the metal silicide regions 254 may be obtained in the active region 202B due to the exclusion of any threshold adjusting semiconductor material. Similarly, in the transistor 250A, a superior uniformity of the entire thickness of the active region 202A, for instance in a transistor width direction, i.e., in a direction perpendicular to the drawing plane of FIG. 2f, since the removal of the mask material (FIG. 2b) may result in a more uniform overall thickness of the active region 202A due to the superior uniformity of the mask material. Since the threshold adjusting semiconductor material 208 may extend to the isolation structure 202C along the width direction, superior uniformity of transistor characteristics may be obtained for the transistor 250A.

Figure 2G:
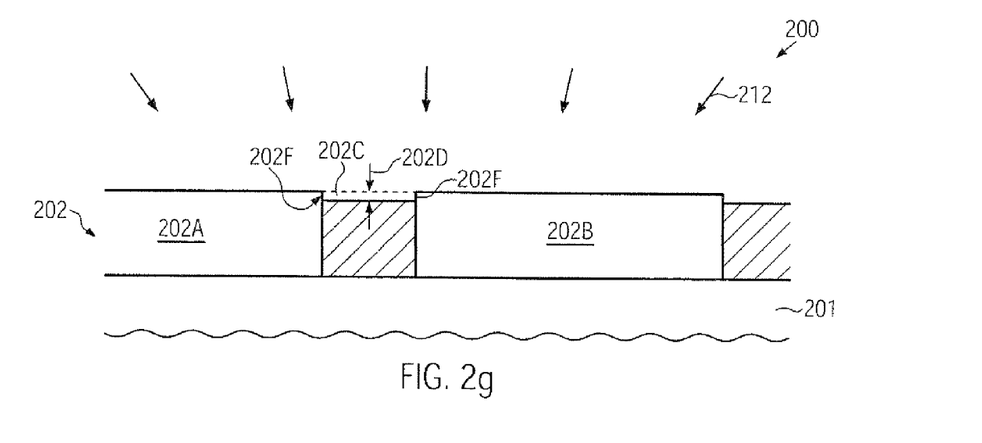

FIG. 2g schematically illustrates the semiconductor device 200 according to still further illustrative embodiments in which superior oxidation uniformity may be accomplished compared to conventional dry oxidation strategies. As illustrated, the device 200 is exposed to an etch ambient 212 in order to selectively remove material from the isolation structure 202C in a controlled manner, thereby forming a recess 202D. For this purpose, any appropriate wet chemical etch recipes or plasma assisted etch recipes may be used. For instance, the recess 202D may be formed on the basis of hydrofluoric acid. Consequently, a portion of the sidewall areas 202F may be exposed by forming the recess 202D.

Figure 2H:
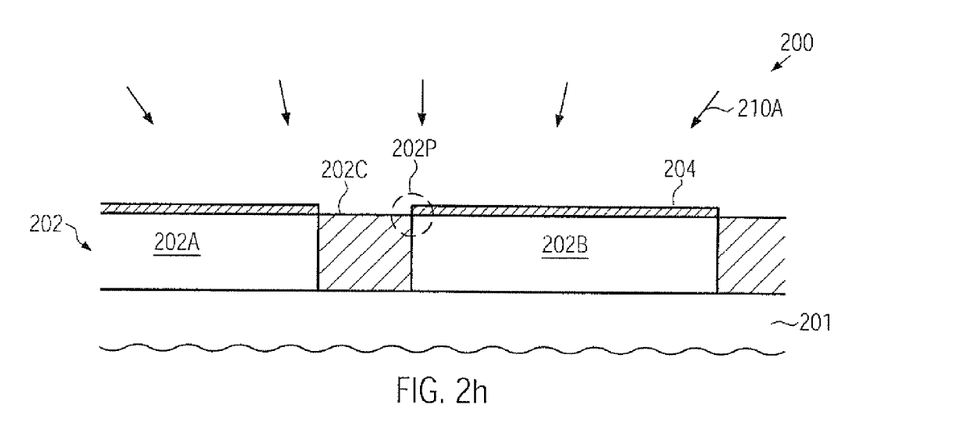

FIG. 2h schematically illustrates the semiconductor device 200 during an oxidation process 210A in order to form the oxide mask layer 204 on the active regions 202A, 202B. Due to the exposure of the sidewall areas 202F (FIG. 2g), a less pronounced stress component may be present in the peripheral region 202P, while an increased surface area is available for oxygen diffusion, thereby increasing the oxidation rate in a locally restricted manner in the peripheral region 202P. Thus, the oxidation process 210A may be performed as a "dry" oxidation process based on similar process parameters as in conventional strategies. Consequently, during the oxidation process 210A, silicon material is consumed in order to form the layer 204, wherein the consumption of silicon material may, in some illustrative embodiments, be comparable or substantially the same as the previously formed recess 202D (FIG. 2g) so that, if desired, the remaining active regions 202A, 202B may have substantially the same height level as the isolation structure 202C. In other cases, any other appropriate adjustment of the thickness of the mask layer 204 with respect to the recess 202D may be selected. Consequently, a high degree of compatibility with conventional process strategy may be maintained by locally adapting the oxidation rate, thereby also enhancing uniformity of the resulting thickness of the mask layer 204. Thereafter, the further processing may be continued as described above, wherein superior re-work margins are provided on the basis of the mask material 204 formed during the oxidation process 210A.

As a result, the present disclosure provides semiconductor devices and manufacturing techniques for forming the same in which transistors may have gate electrode structures based on high-k dielectric materials and metal-containing electrode materials, wherein an appropriate threshold voltage for P-channel transistors and N-channel transistors may be adjusted in an early manufacturing stage on the basis of a threshold adjusting semiconductor alloy. Superior process uniformity and margins with respect to re-workability of substrates prior to the epitaxial growth process may be accomplished by enhancing uniformity of an oxide hard mask layer, which may be accomplished by a wet oxidation process and/or increasing a surface area at peripheral areas of active regions prior to the oxidation process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming an oxide layer on a first active region and a second active region of a semiconductor device by performing a wet oxidation process;
   removing said oxide layer selectively from said first active region;
   forming a layer of a semiconductor alloy on said first active region and using said oxide layer on said second active region as a growth mask, wherein forming comprises performing a cleaning process prior to forming said semiconductor alloy on said first active region, and wherein said cleaning process reduces a thickness of said oxide layer formed on said second active region;
   removing said oxide layer from said second active region; and
   forming a first gate electrode structure of a first transistor on said layer of a semiconductor alloy and a second gate electrode structure of a second transistor on said second active region, said first and second gate electrode structures comprising a gate insulation layer and a metal-containing gate electrode material, said gate insulation layer comprising a high-k dielectric material.

2. The method of claim 1, wherein performing said wet oxidation process comprises establishing an oxidizing ambient at a temperature of approximately 500-1200° C. and introducing hydrogen into said oxidizing ambient.

3. The method of claim 1, wherein performing said wet oxidation process comprises establishing a process ambient on the basis of water vapor at a temperature of approximately 500-1200° C.

4. The method of claim 1, wherein said oxide layer is formed with a thickness of approximately 10 nm or less.

5. The method of claim 1, further comprising performing a second cleaning process when a queue time between said first cleaning process and a process for forming said semiconductor alloy exceeds a predefined threshold.

6. The method of claim 1, wherein forming said layer of a semiconductor alloy comprises performing a selective epitaxial growth process so as to suppress material deposition on said oxide layer.

7. The method of claim 1, further comprising forming an isolation structure that delineates said first and second active regions and removing material of said isolation structure selectively to said first and second active regions prior to performing said wet oxidation process so as to increase an oxidation rate locally at an edge of said first and second active regions.

8. The method of claim 1, wherein said layer of a semiconductor alloy is formed as a silicon/germanium alloy.

9. The method of claim 8, further comprising forming P-doped drain and source regions in said first active region and forming N-doped drain and source regions in said second active regions.

10. A method of forming a semiconductor device, the method comprising:
    forming a silicon oxide layer on a first active region and a second active region by performing an oxidation process, said first and second active regions being delineated by an isolation structure, a thickness variation of said silicon oxide layer in said first and second active regions being approximately 20 percent or less;
    removing said silicon oxide layer selectively from above said first active region;
    forming a threshold adjusting semiconductor material in said first active region and using said silicon oxide layer formed on said second active region as a deposition mask, performing a cleaning process prior to forming said threshold adjusting semiconductor material and after selectively removing said silicon oxide layer from said second active region, wherein said cleaning process reduces a thickness of said silicon oxide layer;
    removing said silicon oxide layer from above said second active region; and
    forming a first gate electrode structure of a first transistor on said threshold adjusting semiconductor material and a second gate electrode structure of a second transistor on said second active region.

11. The method of claim 10, wherein forming said first and second gate electrode structures comprises forming a high-k dielectric material above said threshold adjusting semiconductor material and said second active region and forming a metal-containing electrode material above said high-k dielectric material.

12. The method of claim 10, wherein forming said silicon oxide layer comprises performing a wet oxidation process.

13. The method of claim 12, wherein performing said wet oxidation process comprises supplying at least one of hydrogen and water vapor into a process ambient and establishing a temperature of approximately 500-1200° C.

14. The method of claim 10, wherein forming said silicon oxide layer comprises increasing an oxidation rate of said first and second active regions locally at said isolation structure.

15. The method of claim 14, wherein increasing an oxidation rate comprises removing material of said isolation structure so as to expose a sidewall portion of said first and second active regions.

16. The method of claim 15, wherein said oxidation process is performed without supplying a hydrogen species.

17. The method of claim 10, wherein said threshold adjusting semiconductor material comprises a silicon/germanium alloy.

* * * * *